United States Patent [19]
Lam et al.

[11] Patent Number: 5,937,013
[45] Date of Patent: Aug. 10, 1999

[54] SUBHARMONIC QUADRATURE SAMPLING RECEIVER AND DESIGN

[75] Inventors: Marcos Chun-Wing Lam; Curtis Chih-Shan Ling, both of Kowloon, The Hong Kong Special Administrative Region of the People's Republic of China

[73] Assignee: The Hong Kong University of Science & Technology, The Hong Kong Special Administrative Region of the People's Republic of China

[21] Appl. No.: 08/778,676

[22] Filed: Jan. 3, 1997

[51] Int. Cl.[6] .............................. H03D 1/00; H03D 3/24
[52] U.S. Cl. ............................................ 375/340; 375/376
[58] Field of Search ..................................... 375/340, 342, 375/373, 376, 326, 229, 325, 324

[56] References Cited

U.S. PATENT DOCUMENTS

| | | | |
|---|---|---|---|
| 5,490,176 | 2/1996 | Peltier | 375/325 |
| 5,727,027 | 3/1998 | Tsuda | 375/326 |
| 5,729,173 | 3/1998 | Sato | 375/327 |

*Primary Examiner*—Chi H. Pham
*Assistant Examiner*—Khai Tran
*Attorney, Agent, or Firm*—Burns, Doane, Swecker & Mathis

[57] ABSTRACT

A receiver for down-converting a modulated carrier into its in-phase (I) and quadrature (Q) components for further processing is proposed. This is accomplished using a sampling method in which the signal is sampled directly using a sampling circuit which is driven by a single sampling clock frequency substantially lower than the carrier frequency while allowing the I and Q components to be precisely obtained. Each of the signal samples comprises sub-samples taken successively which represent the in-phase, quadrature, negative in-phase and negative quadrature components of the signal. The negative components permit flexible application of the invention in several modes, including differential mode for the removal of common-mode noise. The invention is useful because it provides an integrated circuit means for precisely obtaining I and Q components of a very high frequency modulated carrier. This greatly eases the difficulty of implementing receiver architectures such as direct down-conversion or low-IF receivers, which permit on-chip integration of traditionally difficult-to-integrate components such as IF filters and VCO circuits while eliminating the need for image-rejection filters.

21 Claims, 2 Drawing Sheets

SUBHARMONIC QUADRATURE SAMPLING RECEIVER AND DESIGN

FIELD OF THE INVENTION

The present invention relates to high-speed receivers for narrow-band communication systems. In particular it relates to high speed receivers which perform quadrature demodulation by sub-harmonic sampling of incoming information carrying RF signals. It also relates to a method for accurately separating the in-phase (I) and quadrature (Q) components of a modulated signal.

BACKGROUND OF THE INVENTION

In modern wireless communication systems, it is the task of the receiver to recover with high sensitivity and accuracy baseband signal data or messages which have been transmitted or broadcast by way of modulation on an radio frequency (RF) carrier. With the advent and popularity of mobile hand-held communication systems which operate in the gigahertz region, it is the goal of communication engineers to monolithically integrate the complete high-speed receiver circuit onto a single integrated circuit (IC) chip, the so-called single-chip receiver, so that very light weight handsets can be made available at an affordable price. Indeed, studies of handheld portable and mobile technologies indicate that cost savings by integration alone are in the region of 20–30%. Apart from the direct benefits of size and cost reduction, the benefit associated with the reduction in power consumption, e.g. heat dissipation and battery operation time, is also considerable.

There are however major hurdles which lie on the way to monolithic integration of digital receivers. Firstly, conventional high frequency receivers comprises a large number of discrete components for radio frequency (RF) signal processing. These components often introduce parasitics and other unknowns which are much less repeatable and predictable than circuits made from the IC process. Individual trimming and tuning of such components which are required to make up for the parasitic and other unknown effects further increase costs. On-chip integration of all such components would thus appear to provide an obvious solution. In addition, reduction of off-chip components also minimises the number of power-hungry drivers which are needed to overcome packaging and interconnect parasitics. However, adaptation of current technologies to integrating some of these passive components on-chip is expensive and requires a change of process which requires money and time.

Secondly, monolithic integration of a high speed digital receiver means that high-speed, low-noise small-signal front-end circuitries and high-density, low-power analogue and digital baseband processing circuitries must be put close together. Finding an integrated circuit technology with the right balance of cost and performance is not an easy compromise.

RECEIVER DESIGNS

Heterodyne Receiver

The heterodyne receiver design, as illustrated in FIG. 1, is the most widely used topology for handsets for mobile communication systems. In this design, the RF signal received by the antenna 100 of the receiver is firstly amplified by a low-noise amplifier 110 which determines largely the overall noise figure of the complete receiver system. The amplified signal is then down-converted to a fixed intermediate frequency (IF) which is characteristic of the system for further processing. Down-conversion is usually performed by mixing the received RF signal with a pure sinusoidal signal produced by a tunable local oscillator 120 (LO). The local oscillator frequency ($f_{LO}$) is chosen so that the IF, LO, RF frequencies are related by the formula:

$$f_{IF}=|f_{LO}-f_{RF}|$$

After the down conversion, the IF signal is further amplified by amplifier 140, filtered by a highly selective IF filter 150 and processed until the embedded signal data is finally recovered.

From the formula above, it is clear that an RF signal which is present at a frequency $f_{LO}+f_{IF}$ as well as one which is present at a frequency $f_{LO}-f_{IF}$ will both be down converted to the IF. In typical applications, only one of these is the desired signal, while the other undesired RF signal is referred to as the "image" signal. To avoid receiving the undesirable image signal, an image-rejection filter 130 which substantially suppresses the image signal is always introduced before the mixer stage. To achieve high image rejection, a high performance image rejection filter must be used. Alternatively, a relatively high IF frequency may be chosen so that the stringent requirements on the image rejection filters may be lessened. Indeed, IF frequencies in the range of 10–100 MHz are quite common. Nevertheless, RF and IF filters are indispensable in such receivers if high performance is to be attained.

One of the greatest challenge in achieving monolithic heterodyne receiver design is the on-chip integration of high performance RF and IF filters using commercially available integrated circuit processing technology. In practice, most RF and IF filters have to be realised by means of off-chip discrete components.

Homodyne Receiver

Another commonly known alternative receiver topology which may be used is the homodyne, or direct conversion, receiver design. In this design, the LO and RF carrier frequency are identical and the IF frequency is therefore zero. When the RF signal is mixed with the LO signal, baseband signal is directly obtained and the problem of image signal is not present.

While the conventional direct conversion approach looks promising, it has several drawbacks which adversely limit its performance:
1) the weak RF signal is shifted directly into a noisy DC environment where DC drift, 1/F noise and other low-frequency noise exist. These adverse conditions put a heavy demand on the quality of amplification and the dynamic range provided by the RF circuitries,
2) non-linearity of mixer circuits causes intermodulation distortion of the received signal which means that a highly linear mixer is required,
3) local oscillator signal leakage can jam the receiver since the LO and RF frequency are the same, and
4) very accurate I and Q demodulation at RF is required to recover any signal which is asymmetric about the carrier, including a broad class of signals such as single-sideband or digitally phase-modulated signals. Imbalances in the phase and amplitude of I and Q conversion produce DC drift which will cause particular problems in systems where the baseband modulation, e.g. GMSK, contains energy at or near DC.

Low-IF-Heterodyne Receiver

Another alternative approach is the low-IF heterodyne design which is a modified version of the heterodyne receiver relying on high precision image-reject mixers which greatly reduces the demand on an image-reject filter. Combination of a low IF with high-precision image-reject mixers means that the resulting IF signal can be easily processed by low-frequency on-chip filtering without the need of off-chip filters which are necessary for high-IF systems.

However, it is well known that if image-reject mixers are to achieve good image rejection, they must have very precise I and Q phase and amplitude matching. For example, a 40 dB image rejection would typically require a phase and amplitude matching of 1 degree and 0.2 dB respectively. The image rejection requirements of 60–70 dB in Global System of Mobile Communication (GSM) mean that an even higher degree of matching precision is required. In the past, such low-IF systems have not been considered practicable since image-reject mixers assembled with hybrid mounted components cannot deliver such precision without tuning. Furthermore, it is also difficult to integrate these components on-chip.

Advances in circuit design and IC technology in the past decade have mitigated many of the problems associated with the homodyne or low-IF systems. For example, increased levels of integration at RF permits high gain amplifiers and AGC circuits to be implemented on-chip, compensating mixer noise at baseband. Adequate isolation between mixer and the RF section combined with shielding alleviates the problem of LO jamming. The imbalances between the I and Q component offsets can be corrected using digital signal processing techniques which were not available a decade ago. However, mixer design remains a challenging issue particularly because of the inherently non-linear nature of their function, which makes their performance sensitive to spurious response.

To circumvent the difficulties surrounding the design of a high-performance high-frequency image-reject mixer suitable for homodyne or low-IF receivers, it is the object of the present invention to provide a high performance quadrature demodulation receiver which performs signal mixing by way of direct sampling of the RF signal which demodulates the signal accurately to the I and Q components. This invention makes possible full utilization of the advantages of linear switches which are readily available in CMOS technology.

This mixing and sampling technique is further refined by applying subharmonic sampling, i.e., sampling below the Nyquist rate, by relying on the fact that the baseband information signals are usually of a narrowband nature. This approach is partly based on the well known principle that down-conversion can be achieved by sampling a modulated carrier at a sub-harmonic frequency. When the sampling frequency is twice the modulation bandwidth, direct-conversion is achieved.

By deliberately under-sampling the RF signal, the receiver circuit is capable of capturing the narrowband signal variation and thereby downconverting the RF signal without a high-power and high bandwidth system. Naturally, pre-mixer anti-aliasing filter would be necessary to mitigate the wideband noise which would otherwise be aliased into an output of half the sample rate.

This sub-harmonic sampling techniques is applicable to both the homodyne and low-IF heterodyne designs. The two major advantages of this approach are firstly that the LO (i.e. the sampling frequency) and RF frequencies are now different, alleviating greatly the LO jamming problem. Secondly, because of the lower LO frequencies, low-speed supporting LO circuits such as oscillators using high-Q resonators, and phase-locking circuits using high Q resonators can be used, making possible many interesting low-power designs.

SUMMARY OF THE INVENTION

According to the present invention, there is provided a quadrature demodulation receiver for narrow-band communication systems comprising means for directly sampling an incoming signal which is modulated on a radio-frequency carrier at a sampling frequency which can be substantially lower than the carrier frequency to demodulate said signal into its in-phase and quadrature components, wherein said sampling means comprises means for obtaining main samples each of which comprises a plurality of sub-samples which are separated by a fixed time delay and which represent the in-phase and quadrature signal components taken for that sampling period.

Preferably, the said sampling means comprises means for firstly locking the in-phase sample to a sub-harmonic of the carrier frequency in a manner similar to conventional coherent receivers, and wherein the sub-samples are then taken at instants which correspond substantially to the in-phase and quadrature sample of the carrier frequency.

Preferably, the said sampling means comprises means for taking four sub-samples which represent the in-phase (I), the quadrature (Q), negative of the in-phase (−I) and negative of the quadrature (−Q)components. Naturally, the components need not be arranged in such an order.

In a preferred embodiment, the time delay, $\tau_{sub.}$, between successive sub-samples within the same sample is substantially equal to five quarters of the period of the un-modulated carrier frequency, i.e. $\tau_{sub.}=(5/4)\tau_{RF}$. Preferably, the time delay, $\tau_{sub}$, between successive sub-samples within the same sample is substantially equal to $\tau_{RF}(N+1/4)$, where $\tau_{RF}$ is the period of the un-modulated carrier frequency and N is a non-zero natural number.

Preferably, the time delay, $\tau_{sub.}$, between successive sub-samples within the same sample is substantially equal to $\tau_{RF}(N+(2M+1)/4)$, where $\tau_{RF}$ is the period of the un-modulated carrier frequency, N is a non-zero natural number and M is a natural number including zero.

Preferably, the sampling frequency is substantially equal to the carrier frequency divided by (4N+2M+1) where N is any natural number and M is any natural number including zero.

Preferably, the sampling frequency is also substantially equal to the carrier frequency divided by (4N+2M+K+1), where N, M and K are natural numbers and N is non zero.

In another preferred embodiment, the sampling frequency is equal to the sum of the carrier (RF) and intermediate (IF) frequency divided by the factor (4N+2M+1) where N is any natural number and M is any natural number including zero.

According to another aspect of the present invention, there is provided a direct sub-harmonic sampling method for quadrature demodulation for receivers for communication systems comprising demodulating an incoming narrow-band modulated signal on a carrier frequency into its in-phase and quadrature components by direct sampling, wherein said sampling is performed at a sampling frequency which is substantially lower than the carrier frequency, and comprising obtaining main samples each of which comprises a plurality of sub-samples which are separated by a fixed time delay, wherein said sub-samples represent the in-phase and quadrature signal components taken for that sampling period.

Preferably, the sampling is performed by first locking or tuning the in-phase sampling clock to a subharmonic of the carrier frequency in a manner similar to conventional coherent receivers (e.g. with a PLL or closed loop). However, the present invention can also be operated open-loop (unlocked), as with a conventional mixer, so long as the sampling clock is precisely and accurately tuneable (e.g. to within one part in two thousand, easily achievable with current technology) and low-jitter.

In a preferred method each said sample comprises four sub-samples which represent the in-phase, the quadrature, negative of the in-phase and negative of the quadrature components. Naturally, the components need not to be arranged in such an order.

Preferably in a preferred method, the time delay, $\tau_{sub}$, between successive sub-samples within the same sample is substantially equal to five quarters of the period of the un-modulated carrier frequency, i.e. $\tau_{sub}=(5/4)\tau_{RF}$. Preferably the time delay, $\tau_{sub}$, between successive sub-samples within the same sample is substantially equal to $$\tau_{RF} * \left( N + \frac{2M+1}{4} \right).$$

BRIEF DESCRIPTION OF THE DRAWINGS

The present invention will now be explained and illustrated by way of example and with reference to the accompanying drawings, in which.

DETAILED DESCRIPTION OF PREFERRED EMBODIMENTS

Figure 1:
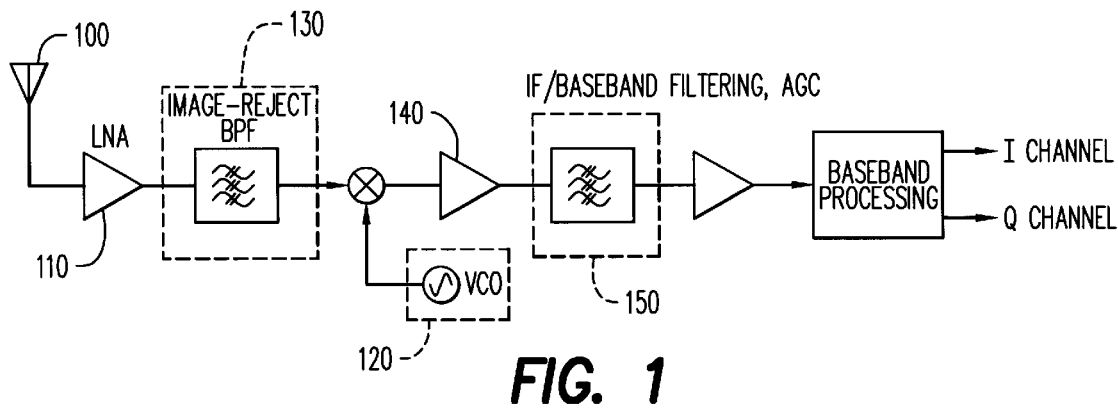
FIG. 1 is a schematic diagram of a conventional quadrature demodulation receiver showing in dotted-boxes the component parts which are difficult to be integrated on-chip.
Figure 2A:
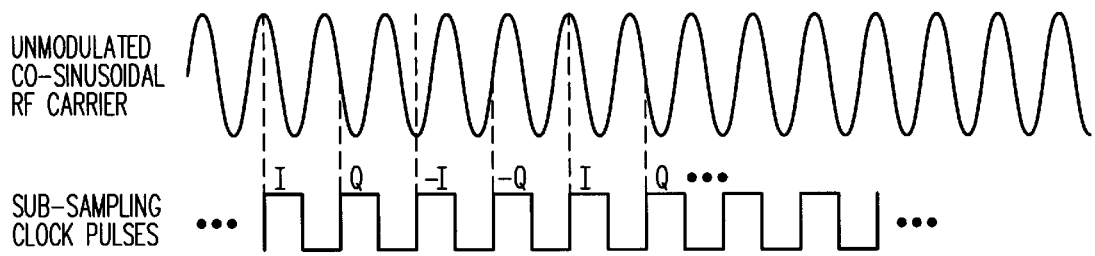
FIG. 2a shows an example of the timing relationship between a sinusoidal RF carrier and a stream of sub-sampling clock ($f_{sub}$) pulses for the receiver of the present invention, in which the delay between successive timing pulses, $\tau_{sub}$, is equal to $(1+1/4)\tau_{RF}$.
Figure 2B:
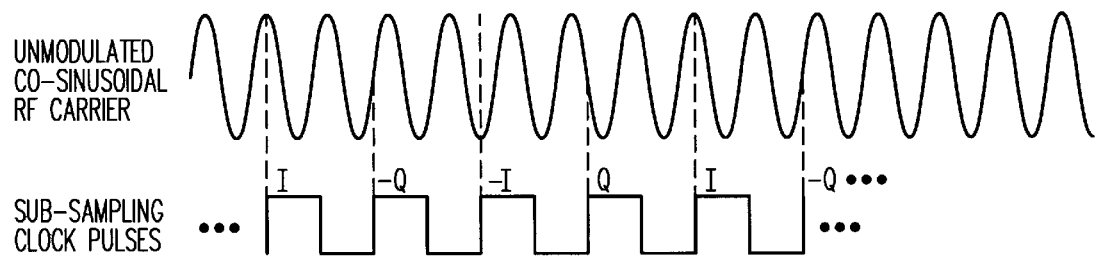
FIG. 2b shows an example of the timing relationship between a sinusoidal RF carrier and a stream of sub-sampling clock ($f_{sub}$) pulses for the receiver of the present invention, in which the delay between successive timing pulses, $\tau_{sub}$, is equal to $(1+3/4)\tau_{RF}$.
Figure 3:
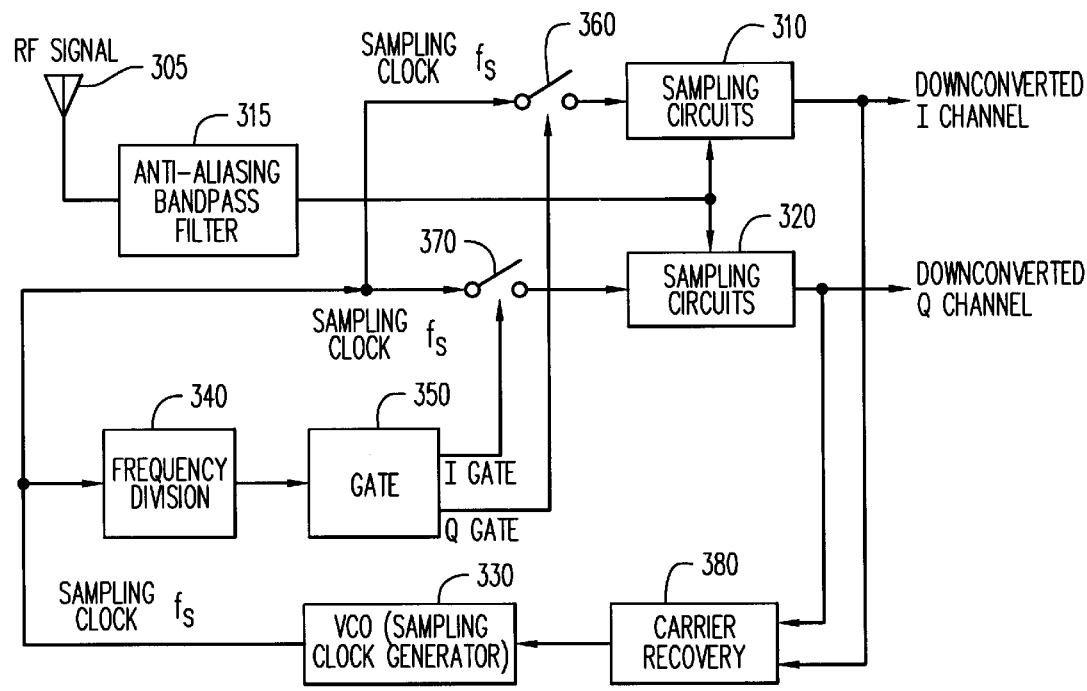
FIG. 3 is a schematic block diagram showing for example a circuit arrangement suitable for the receiver of the present invention.

The receiver illustrated in FIG. 3 in accordance with the present invention down-converts the incoming RF signal 305 into its base-band in-phase (I) and quadrature (Q) components by means of in-phase and quadrature sampling circuits 310 and 320 respectively which sample the incoming RF waveform directly at a considerably lower sampling frequency than the carrier frequency. The signal sampling may for example be performed by conventional sampling circuits which comprise simple CMOS switches and sample-and-hold capacitors and integrated with low-frequency differential amplifiers to drive IF circuits.
Direct-Conversion Referring to the timing diagrams of FIGS. 2a and 2b, there is shown a wave train of an unmodulated co-sinusoidal RF carrier aligned with a train of sub-sampling clock pulses. In the first preferred embodiment, the sampling circuit is driven on the rising edge of the clock transition. To obtain the I and Q components by direct RF sampling, the sampling circuit samples the incoming RF signal at a sampling frequency which is considerably lower than that of the RF carrier frequency. Since the purpose of this sampling scheme is to directly extract the base-band quadrature components without the need of intermediate frequency components, this is a direct conversion demodulation scheme.

The signal sampling is performed in a packet mode in which each complete sample packet comprises the useful quadrature components. In the present embodiment, the sample packet comprises respectively the I, Q, -I, -Q components. This is realised by including in each complete sampling clock period a set of four consecutive sub-sampling pulses which respectively sample the I, Q, -I & -Q components.

An obviously advantageous aspect of this packet sampling technique is that the sampling circuit can generate I and Q sampling delays which are dependent on the relationship between the RF frequency ($f_{RF}$) and the frequency ($f_{sub}$) of the sub-sampling pulses, but not on component-dependent delays.

However, it should be noted that the components need not necessarily be arranged in the respective sequence of I, Q, -I & -Q. For example, referring to FIG. 2b, a sample packet can as well comprise all the four components while arranged in the sequence of I, -Q, -I & Q.

Ideally, the delay ($T_{sub}$) between each successive sub-sampling pulse within the same main sampling packet period is an integer number plus an odd integer multiple of one quarter of an RF carrier cycle, that is, $$\tau_{sub} = \tau_{RF} * \left( N + \frac{2M+1}{4} \right),$$

where N is a non-zero natural number, M is a natural numbers including zero, $\tau_{RF}$ ($=1/f_{RF}$) is the period of the un-modulated carrier frequency and $\tau_{sub}$ ($=1/f_{sub}$) is the period of the sub-sampling pulses.

Note that when both N and M equals zero, this yields $\tau_{sub}=\tau_{RF}/4$ which is the case of direct conversion by sub-harmonic sampling at one-fourth of the un-modulated carrier frequency and is therefore not within the scope of the present invention. In the present preferred embodiment, N=1, M=0 and therefore $\tau_{sub}=1.25\ \tau_{RF}$.

Furthermore, the delay between successive main sampling cycles ($\tau_s$), which determines the overall sampling frequency, is preferably a natural number multiple, K, of the RF carrier cycles plus four times the subsampling clock pulses to take into account the four sub-sampling cycles in each packet. That is:

$$\tau_s = 4(N + (2M+1)/4)\tau_{RF} + K\tau_{RF},$$
$$= (4N + 2M + K + 1)\tau_{RF}$$

where N= is a non-zero natural number and M and K are natural numbers including zero. Thus, in the example of FIG. 2a, N=1, M=K=0, the main sampling delay is five RF-carrier cycles and the overall sampling frequency is therefore $f_{RF}/5$.

In the example of FIG. 2b, N=1, M=1, and K=0, the main sampling delay is seven RF-carrier cycles and the overall sampling frequency is therefore $f_{RF}/7$.

Figure 4:
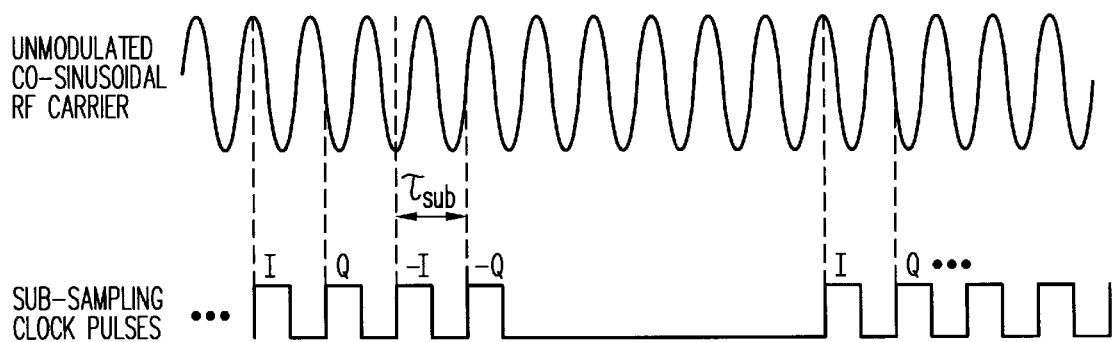
FIG. 4 is a timing relationship diagram in which the delay between successive main sampling pulses is ten cycles of the un-modulated RF carrier frequency.

In the embodiment of FIG. 4, N=1, M=0, and K=5, the main sampling delay is 10 RF-carrier cycles and the overall sampling frequency is therefore $f_{RF}/10$.

The main sampling period for the example in FIG. 2a comprises a four-clock cycle, the first sub-sampling clock pulse is used to time the sample for, say, the I component. The next pulse is used to time the Q component. The next two subsequent pulses then time the –I and –Q components respectively, and the cycle then repeats again for the next packet sampling.

On the other hand, the main sampling period for the example in FIG. 2b also comprises a four-clock cycle, the first sub-sampling clock pulse is used to time the sample for, say, the I component. The next pulse is used to time the –Q component. The next two subsequent pulses then time the –I and Q components respectively, and the cycle then repeats again for the next packet sampling.

By phase locking one sample, for example, the I sample, to a subharmonic of the incoming RF signal using conventional phase locking techniques, the sampling delays for the Q, –I and –Q can be easily derived with high accuracy. In other words, once the sampling circuits is locked with one of the I or Q components, the precise I–Q timing relationship results as a direct by-product.

Naturally, the present invention can also be operated by means of tuning using an open-loop (un-locked) sampling clock which is found in many conventional mixers, so long as the sampling clock is precisely and accurately tunable, e.g. to within one part in two thousand, which is easily achievable with current technology, and with a low-jitter.

Using this technique, even a frequency error of 1 MHz means a timing error of less than 0.4 degree at a carrier frequency of 1 GHz. Such a timing error is highly unlikely for modern day applications given the almost exact frequency match and minimum phase jitter of conventional phase locked loops. Even with errors of this magnitude, the system can easily remove them as system error by means of either precision analog or digital baseband circuits, as long as they are systematic errors, as would be the case with a frequency error.

Thus, with a direct sub-harmonic sampling circuit based on this timing relationship, the following can be achieved:
1) Precise, low-jitter I & Q sampling, with potential accuracy of phase delay between I and Q samples mostly limited by the jitter of the sampling clock and incoming RF signal relative to the sampling frequency. Precision is limited by the following factors: i) clock rise time, ii) clock jitter or short term phase instability, iii) frequency error between the RF and sampling frequency, iv) device mismatch, and v) signal path mismatches. In practice, phase mismatch could be better than 0.1 degree RMS since the subharmonic clock can be generated with low-jitter and short-term stability of about one part in $10^{12}$. Furthermore, since in practice the I and Q sub-samples are sampled with only a few intervening RF cycles, jitter accumulation between I and Q sub-samples would not cause any observable problem which requires serious treatment.
2) Inherent synchronisation between frequency control and I & Q sampling delay. This is so since by phase locking the sampling clock to the RF signal, there exists a highly accurate frequency relationship between them. Consequently, highly precise I and Q component extraction can be achieved.
3) Low-power, simple CMOS sampling and timing generation circuits can be used. This means compact size and conventional high-speed sampling designs can be utilised. This means that the receiver circuits can be fully compatible with low-frequency analogue switched capacitor, data-acquisition and digital processing circuits.

Referring again to FIG. 3 in which the block diagram of an implementation of an embodiment of the receiver design is shown. A clock circuit 330 generates a stream of sub-sampling clock pulses according to the relationship:

$$f_{sub} = \frac{f_{RF}}{\left(N + \frac{2M+1}{4}\right)},$$

where N= a non-zero natural number and M is a natural number including zero.

This clock pulse stream is broken down and grouped into packets each of which comprises four sub-sampling cycles and each is separated by a delay of $$\tau_{sub} = \tau_{RF} * \left(N + \frac{2M+1}{4}\right).$$

Since both the I & Q components are each sampled once during a complete clock cycle, $\tau_s$, it follows that the sampling frequency of the I & Q components, $f_I$ & $f_Q$ are equal and is given by $$f_I = f_Q = \frac{f_{RF}}{(2M + 4N + K + 1)} = f_s$$

A full sampling clock period, $\tau_s$, would therefore comprise at least 4 sub-sampling pulses and possibly plus a natural number, K, multiple of the un-modulated carrier perord, $\tau_{RF}$, and is determined by the relation:

$$\tau_s = (2M+4N+K+1)\tau_{RF},$$

N=1,2,3. . . ,

M and K=0, 1, 2, 3, . . .

In the present embodiment, this timing relationship is achieved by a frequency divider 340 which divides the carrier frequency by (2M+4N+K+1). Note that in the case where K is one plus an integer multiple of 4, the circuit can be operated with a single clock frequency. It is this feature which is essential to producing very high accuracy between I and Q, thus minimising jitter. Since all other clocks can be derived from this single clock and therefore no additional sychronised clocks are needed in the circuit, the complexity of the circuit is greatly reduced.

In the specific embodiment of FIG. 2a where N=1 and M and K=0, the main sampling clock period, $\tau_s$, is equal to five times the period of the RF carrier, $\tau_{RF}$ Similarly, in the specific embodiment of FIG. 2b where N=M=1 and K=0, the main sampling clock period is equal to seven times the period of the RF carrier. Furthermore, in the specific embodiment of FIG. 4 where N=1, M=0 and K=5, the main sampling clock period is equal to ten times the period of the RF carrier.

This divided clock signal then gates through the use of a gate 350 the sampling clock of the I and Q sampling switches 360 and 370 respectively. Because the sampling clock passes through the gates virtually unadulterated, the delay between I and Q channels is guaranteed as long as reasonable synmmetry between the channels is maintained in layout. As mentioned before, conventional sampling circuitries can be utilised and an anti-aliasing filter 315 is of course required in front of the sampling circuits to provide improved performances. The output signals from the sampling circuits 310 and 320 are provided to a circuit 380 to recover the original carrier signal, which is provided as an input signal to the clock generator 330, thereby forming the phase-locked loop which locks the clock signal to the samples.

While each sample packet in this scheme comprises four quadrature components, it should be appreciated that subsequent signal processing can be performed by partial selection of the subsamples. For example, subsample sets like [I,Q], [I,-Q], [-I ,Q] or [-I, -Q] may be selected from the complete sample packet of [I, Q -I, -Q] for base-band signal processing in single-ended systems, although this may represent a degree of performance degradation.

Furthermore, while the present invention has been explained by reference to sample packets each comprising 4 subsamples, i.e., [I, Q, -I, -Q], it would be obvious that other forms of sample packet can be used. For example, a sample packet can be made up of subsamples in any one of following packet forms:- [I, Q], [I,-Q], [-I, Q], [-I,-Q], [I, Q, -I], [I, -I, Q], [I,-I,-Q], etc. . .

Naturally, the four subsample packet provides a preferred demodulation scheme which offers high performance resulting from enhanced immunity to common-mode interference or other spurious offsets which are undesirably introduced into the system.

Low-IF Conversion

In a second preferred embodiment, the circuit arrangement, sampling scheme and sampling timing scheme employed are substantially the same as the direct conversion method above. However, in order to avoid problems associated with direct conversion method, an IF element is deliberately introduced by way of a constant sampling time deviation. This sampling time deviation produce an IF modulation and introduces a phase offset which can subsequently be adjusted. In this method the sampling frequency, $f_s$, deviates slightly from the relationship above by a frequency offset $\Delta f$, such that $$f_s = \frac{f_{RF}}{2M + 4N + K + 1} \pm \Delta f,$$

the effect of such sampling is to down-convert the modulated carrier to an IF frequency. In a four-subsample packet scheme, the relationship between the sampling frequency, $f_s$, the RF frequency, $f_{RF}$, and the IF frequency, $f_{IF}$, is given by:

$$f_s = \frac{f_{RF} + f_{IF}}{2M + 4N + K + 1}$$

and it can be shown that the new sub-sampling clock period, i.e., the time between I & Q sampling instants, is given by $$\tau_{sub} = \left(\frac{2M + 4N + 1}{4}\right) * \left(\frac{1}{f_{Rf} + f_{IF}}\right)$$

Also, the quadrature relationship between the I and Q components is preserved but with the introduction into the system of a phase offset which is equal to:

$$\Delta\phi = 2\pi \frac{\tau_{offset}}{\tau_{RF}} \text{ (radians)},$$

where $$\tau_{offset} = \left(\frac{1}{f_{RF}} - \frac{1}{f_{Rf} + f_{IF}}\right) * \left(\frac{2M + 4N + 1}{4}\right)$$

which means that the lower the IF frequency, the less the phase offset. This phase offset is systematic, predictable and has a linear relationship with the IF frequency. Therefore phase offset adjustment can be made in a straight forward manner. For example, in a typical wireless channel, the bandwidth is usually less than 500 kHz which means that the IF can be as low as 250 kHz. Assuming a system with M=0. N=2 and an IF of 300 kHz is used, a constant phase offset as low as 0.27 degree will be introduced if the IF frequency is exactly at 300 kHz when the RF carrier frequency is 900 MHz. Even where the actual IF frequency deviates by an amount equal to half the signal bandwidth, e.g. 250 kHz, only an error of 0.45 degree will be introduced. This straight forward calculation thus confirms the suitability for application of this precision quadrature subsampling circuit for implementation as a low-IF quadrature down-conversion front-end circuit.

This method thus produces I and Q outputs at a low IF frequency which is typically in the region of 100–500 kHz, a very small fraction of the RF carrier frequency. Such a low IF permits on-chip band-pass filtering or digital signal processing at low power. Just as in the case of the direct conversion method, the –I and –Q components can be inverted and combined with the I and Q components respectively or ignored. However the sampling frequency is deliberately detuned by the IF according to the above relationship.

Thus, for example, for an unmodulated RF carrier input, the sampled outputs from the two channels are two low-frequency sinusoids at $f_{IF}$. The outputs are out of phase by 90+$\Delta\phi$ where $\Delta\phi$ is the small phase offset produced by the detuning and is about 0.27° for a 300 kHz IF at a RF carrier frequency of 900 MHZ. This offset is systematic and can be adjusted if the straight forward digital signal processing techniques are used in the baseband processor. Because this low-IF mode circumvents many of the direct-conversion difficulties while still lending itself to single-chip implementation, this scheme is likely to be the most effective and promising mode of operation for future integrated receiver designs.

Conventional IF Conversion

Obviously, the present method is also applicable for conventional IF conversion schemes which base simply on the principle that sampling at subharmonic down-converts the frequency. In this method, instead of processing the –I and –Q components, for example by rectifying the sampled output, the components are used to produce an IF component whose frequency $f_{IF}$ is $f_{sub}/4$, since the I, –I cycle repeats at a rate $f_{sub}/4$, and similarly for Q, –Q. However, this IF frequency is likely to be too high to allow on-chip integration of channel-selection filters and is therefore not particularly attractive.

An obvious added advantage of the present invention is that the circuit components are readily realisable in CMOS technology and the potential for monolithic integration is high.

We claim:

1. A quadrature demodulation receiver for narrow-band communication systems comprising: means for directly sampling an incoming signal which is modulated on a carrier signal having a carrier frequency, said sampling being performed at a sampling frequency which is substantially lower than the carrier frequency to demodulate said incoming signal into inphase and quadrature components, wherein said sampling means includes means for obtaining main samples, each of which comprises a plurality of sub-samples which are separated by a fixed time delay and which represent the in-phase and quadrature signal components taken for a sampling period.

2. A receiver according to claim 1, wherein said sampling means locks the in-phase sample to a subharmonic of the carrier frequency and wherein the subsamples are then taken at instants which correspond substantially to the in-phase and quadrature samples of the incoming signal.

3. A receiver according to claim 1, wherein said sampling means tunes the in-phase sample to a subharmonic of the carrier frequency and wherein the subsamples are then taken at instants which correspond substantially to the in-phase and quadrature samples of the incoming signal.

4. A receiver according to claim 1, wherein said sampling means takes four sub-samples which represent the in-phase, the quadrature, negative of the in-phase and negative of the quadrature components.

5. A receiver according to claim 2 wherein successive sub-samples within the same sample are spaced by a time delay, $\tau_{sub.}$, which is substantially equal to five quarters of the period of said carrier frequency, $$\tau_{sub.} = (5/4)\tau_{RF}.$$

6. A receiver according to claim 2 wherein successive sub-samples within the same sample are spaced by a time delay, $\tau_{sub.}$, which is substantially equal to:

$$\tau_{sub.} = \tau_{RF}(N+1/4)$$

where $\tau_{RF}$ is the period of said carrier frequency of the incomming signal and N is a non-zero natural number.

7. A receiver according to claim 2 wherein the successive sub-samples within the same sample are spaced by a time delay, $\tau_{sub}$, which is substantially equal to:

$$\tau_{sub.} = \tau_{RF}(N+(2M+1)/4)$$

where $\tau_{RF}$ is the period of said carrier frequency, N is a non-zero natural number and M is a natural number including zero.

8. A receiver according to claim 2 wherein the sampling frequency is substantially equal to the carrier frequency divided by (4N+2M+1) where N and M are natural numbers and N is non zero.

9. A receiver according to claim 2 wherein the sampling frequency is substantially equal to the carrier frequency divided by (4N+2M+K+1), where N, M and K are natural numbers and N is non-zero.

10. A receiver according to claim 2 wherein the sampling frequency is equal to the sum of the carrier (RF) and intermediate (IF) frequency divided by a factor (2M+4N+1), where N and M are natural numbers and N is non zero.

11. A receiver according to claim 2 wherein the sampling frequency is equal to the sum of the carrier (RF) and intermediate (IF) frequency divided by a factor (2M+4N+K 1), where N, M and K are natural numbers and N is non zero.

12. A quadrature demodulation receiver for narrow-band communication systems comprising;
locking means for firstly locking an in-phase sample to a sub-harmonic of a carrier frequency,
means for sampling an incoming signal by successively sampling in-phase and quadrature signal components within a single sampling period and at instants which correspond substantially to the in-phase and quadrature phase components of the carrier frequency and at a sampling frequency which is substantially lower than said carrier frequency.

13. A direct sub-harmonic sampling method for quadrature demodulation for receivers for communication systems comprising;
demodulating an incoming narrow-band modulated signal on a carrier frequency into in-phase and quadrature components by direct sampling, wherein said sampling is performed at a sampling frequency which is substantially lower than the carrier frequency, and
obtaining main samples each of which comprises a plurality of subsamples which are separated by a fixed time delay, wherein said sub-samples represent in-phase and quadrature signal components taken for a sampling period.

14. A sampling method for receivers according to claim 13 wherein said sampling is performed by firstly locking the in-phase sample to a sub-harmonic of the carrier frequency and the subsamples are then taken at instants which correspond to the in-phase and quadrature sample of the carrier frequency.

15. A sampling method for receivers according to claim 13 wherein:
said sampling is performed by firstly tuning the in-phase sample to a sub-hannonic of the carrier frequency and the subsamples are then taken at instants which correspond to the in-phase and quadrature sample of the carrier frequency.

16. A sampling method for receivers according to claim 13 wherein:
each said main sample comprises four sub-samples which represent the in-phase, the quadrature, negative of the in-phase and negative of the quadrature components.

17. A sampling method for receivers according to claim 13 wherein:
the time delay, $\tau_{sub.}$ between successive sub-samples within the same sample is substantially equal to five quarters of the period of said carrier frequency, $\tau_{sub.} = (5/4)\tau_{RF}$.

18. A sampling method for receivers according to claim 13 wherein:
the time delay, $\tau_{sub.}$, between successive sub-samples within the same sample is substantially equal to $\tau_{sub.} = \tau_{RF} * (N+(2M+1)/4)$
where $\tau_{RF}$ is the period of said carrier frequency, N is a non-zero natural number and M is a natural number including zero.

19. A sampling method for receivers according to claim 13 wherein:
the sampling frequency is substantially equal to the carrier frequency divided by a factor (2M+4N+1) where N and M are natural numbers and N is non-zero.

20. A sampling method according to claim 13 wherein the sampling frequency is substantially equal to the carrier frequency divided by (4N+2M+K+1), where N, M and K are natural numbers and N is non zero.

21. A sampling method for receivers according to claim 13 wherein:
the sampling frequency is substantially equal to the sum of carrier (RF) and intermediate (IF) frequency divided by a factor (2M+4N+K+1), where N, M and K are natural numbers and N is non zero.

* * * * *